United States Patent [19]
Ito et al.

[11] Patent Number: 5,581,531
[45] Date of Patent: Dec. 3, 1996

[54] METHOD OF MAKING OPTICAL DISK MASTER AND AN OPTICAL DISK

[75] Inventors: Masaru Ito, Sagamihara; Masumi Fujita, Toride, both of Japan

[73] Assignees: Hitachi, Ltd., Tokyo; Hitachi Maxell, Ltd., Osaka, both of Japan

[21] Appl. No.: 273,627

[22] Filed: Jul. 12, 1994

Related U.S. Application Data

[63] Continuation of Ser. No. 558,524, Jul. 27, 1990, abandoned.

[30] Foreign Application Priority Data

Aug. 2, 1989 [JP] Japan ..................... 1-199442

[51] Int. Cl.⁶ ..................................... G11B 7/00
[52] U.S. Cl. ........................... 369/100; 369/109
[58] Field of Search .................... 369/100, 109, 369/110, 111, 112, 44.23, 44.21, 44.39, 272, 275.1, 275.3, 275.4, 277, 287, 285

[56] References Cited

U.S. PATENT DOCUMENTS

| | | | |
|---|---|---|---|
| 4,179,708 | 12/1979 | Sheng et al. | |
| 4,346,164 | 8/1982 | Tabarelli et al. | |
| 4,509,162 | 4/1985 | Rester | 369/275 |
| 4,996,682 | 2/1991 | Yanagihara et al. | 369/275.4 |
| 5,036,511 | 7/1991 | Goldberg et al. | 369/284 |
| 5,051,340 | 9/1991 | Tyan et al. | 430/321 |
| 5,121,378 | 6/1992 | Hirose et al. | 369/112 |
| 5,132,843 | 7/1992 | Aoyama et al. | 359/573 |

FOREIGN PATENT DOCUMENTS

| | | |
|---|---|---|
| 184750 | 6/1986 | European Pat. Off. |
| 314185 | 5/1989 | European Pat. Off. |
| 346844 | 12/1989 | European Pat. Off. |
| 2539690 | 3/1976 | Germany |
| 54-83810 | 7/1979 | Japan |
| 60-28048 | 2/1985 | Japan ................. G11B 7/26 |
| 60-236122 | 4/1986 | Japan |
| 63-114127 | 9/1988 | Japan |

OTHER PUBLICATIONS

"Modulieren der Grosse . . . Aufzeichnungstrager", Neues Aus Der Technik, No. 3, 15 Aug. 1985, Wurzburg De, p. 3.
Hitachi Review (HyoRon) vol. 65, No. 10, 1983–10 pp. 23–28 JP–A–63–114127.
Japanese Literature "Wave Optics" by Hiroshi Kubota, published by Iwanami shoten, 1971 pp. 175–177.
"Philips Technical Review" vol. 40, No. 10, 1982 pp. 287–297.

Primary Examiner—Tommy P. Chin
Assistant Examiner—Robert Chevalier
Attorney, Agent, or Firm—Antonelli, Terry, Stout & Kraus

[57] ABSTRACT

An optical disk master having a diffraction structure including guide grooves and small pre-pits of a width narrower than a diffraction limit determined by a wavelength of light used is produced by preparing a photoresist layer subjected to anti-dissolution surface treatment, narrowing the spot diameter of a zero-th diffracted beam irradiated on the photoresist layer by a super resolution optics device, and effecting high contrast development to leave behind, as it is, a portion of the photoresist layer exposed to adverse higher order diffracted beams caused by super resolution. An optical disk produced from the master has a diffraction structure including tracks and/or pre-pits formed along a spiral track or concentric tracks and having a width narrower than a diffraction limit determined by a wavelength of light used in the course of formation of the diffraction structure.

19 Claims, 6 Drawing Sheets

OPTICAL STOP DISTRIBUTION OF ZERO-TH DIFFRACTED BEAM ON PHOTORESIST LAYER

WIDTH OF LINEAR STOP DIAMETER OF CIRCLE / LIGHT BEAM DIAMETER ($\ell/D$)

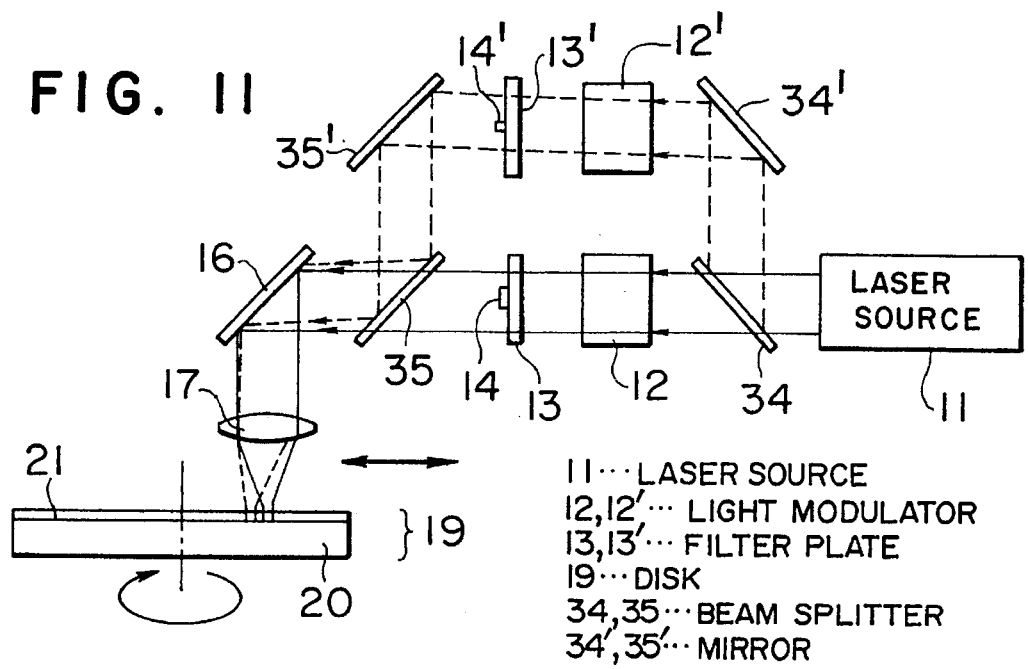
FIG. 11
- 11···LASER SOURCE
- 12,12'···LIGHT MODULATOR
- 13,13'···FILTER PLATE
- 19···DISK
- 34,35···BEAM SPLITTER
- 34',35'···MIRROR
FIG. 12A
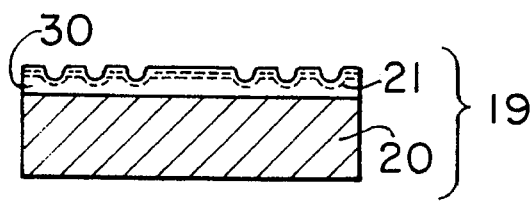
FIG. 12D
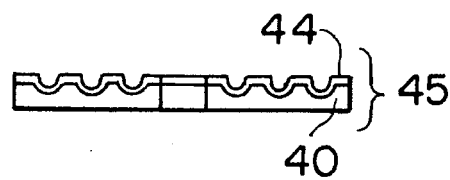
FIG. 12B
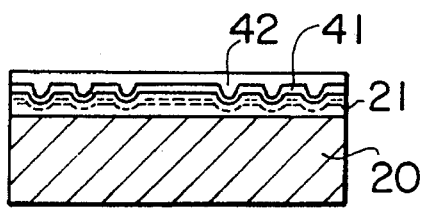
FIG. 12E
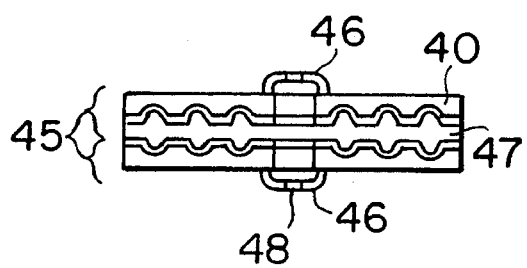
FIG. 12C
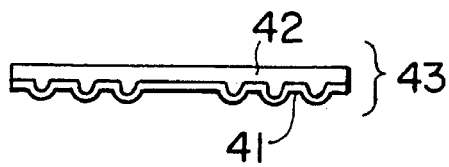

METHOD OF MAKING OPTICAL DISK MASTER AND AN OPTICAL DISK

This application is a continuation of application Ser. No. 07/558,524, filed Jul. 27, 1990, now abandoned.

BACKGROUND OF THE INVENTION

1. Field of the Invention

The present invention relates to production of an optical disk master and an optical disk, and more particularly to a master disk production method suitable for production of a high density data recording optical disk and this type of optical disk.

2. Description of the Related Art

An optical disk as been put to use as a high density data recording medium. Formation of a relief shaped pattern (diffraction structure) comprised of pre-pits and guide tracks formed in the optical disk begins with production of a master disk in accordance with the procedure as shown in FIGS. 10A to 10C. Conventionally, a positive type photoresist layer 5 is formed on a glass substrate 6 by spin coating as shown in FIG. 10A and a light beam modulated in intensity by a signal to be recorded (a signal for formation of pre-pits such as addresses and clock or a signal for formation of guide tracks) is focused by means of a recording lens 17 of a master disk cutting machine to expose the photoresist layer 5. At that time, latent images 32' and 33' are formed in the photoresist layer 5 corresponding to an intensity distribution 31' of the focused optical spot. By setting the threshold of development to a value which prevents the latent image 33' due to a higher order diffracted beam from being developed, a guide groove 8, for example, can be formed. Actually, since the higher order diffracted beam is very weak and its latent image 33' is also weak, the conventional development process in which surface roughness of the photoresist layer is suppressed will do. A stamper is produced from this master disk by plating and many replica disks are made using the stamper. A recording film is deposited on the replica disk and the replica disk is finished to complete an optical disk. A method of making this type of optical disk is described in, for example, an article "Manufacture of Laser Vision Video discs by a Photopolymerization Process" in Philips Technical Review, Vol. 40, No. 10, 1982, pp 287–297.

The relief shape (diffraction structure) of the pre-pit and guide track of the master disk is determined by the optical spot intensity distribution of the cutting machine and the development condition. Narrowing of the optical spot diameter of the zero-th diffracted beam is limited by a diffraction limit of the recording lens and therefore formation of a master disk having a relief pattern (diffraction structure) of a narrower width than the diffraction limit is difficult to achieve. At present, an Ar laser of 458 nm beam or a He-Cd laser of 442 nm beam is used as light source and a positive type resist is used as photoresist. The recording lens of the cutting machine has a numerical aperture NA of about 0.9 and hence, the optical spot diameter measures about 0.5 μm which approximately equals the lower limit of the width of the pit and track.

SUMMARY OF INVENTION

In order to achieve high recording density in the optical disk, the light source of the drive system is required to have a short wavelength so as to make small the optical spot diameter used for write/read operation. In the optical disk, corresponding to that, it is necessary to make small a relief shaped pattern constituting a diffraction structure and to narrow the track pitch in compliance with the intended high recording density. With the afore-mentioned conventional method, since narrowing the optical spot diameter is limited by the diffraction limit determined by the beam wavelength lens numerical aperture NA, the diffraction structure and track pitch must be made to be small by controlling only the development condition, so, drastic improvements cannot be expected. As described previously, reduction in the size of the optical spot is one way to small the relief shaped pattern of diffraction structure comprised of pre-pits and guide tracks. However, the laser for cutting machine must be a continuous wave laser of low noise in which drastic reduction in wavelength is difficult to achieve and at present, 325 nm of the He-Cd laser is considered to be the lower limit. This value of wavelength is as short as about 70% of 458 nm wavelength of the Ar laser presently widely used, but development of light modulator and recording lens which are commensurate with this short-wavelength laser still remains unsolved. On the other hand, it is difficult to increase the lens NA beyond the presently available value. Under these circumstances, there arises a problem as to how the relief shaped pattern of diffraction structure comprised of pre-pits and guide tracks formed in the master disk can be made to be small so as to meet the accelerated decrease in wavelength in the drive system.

Accordingly, an object of the present invention is to provide a method of making an optical disk master having a diffraction structure comprised of small pre-pits and guide tracks of narrow width by using the presently available, simple technique.

Another object of the invention is to provide a method of making an optical disk master having a diffraction structure comprised of pre-pits and/or guide tracks having a width narrower than a diffraction limit determined by a wavelength of light used.

Still another object of the invention is to provide a high recording density optical disk having a diffraction structure comprised of guide tracks and/or pre-pits of narrow width.

To accomplish the above objects, a feature of the invention includes the use of an anti-dissolution surface treatment for the photoresist layer and of a super resolution optical system. In the anti-dissolution surface treatment, an unexposed photoresist layer is immersed in a developer for a short period of time and thereafter washed with water and dried to form, on the surface of the resist layer, an anti-dissolution layer having small solubility to the developer. "Super resolution" means a phenomenon in which resolution is raised beyond that determined by diffraction dependent on the numerical aperture (NA) of the lens by changing the amplitude or phase distribution of the light beam passing thorough pupil of the lens. In an embodiment of the invention, the super resolution optical system can be realized by using in combination a lens and an optical filter for modulating light passing through the pupil of the lens in amplitude or phase distribution. For example, an annular aperture filter for stopping the central portion of the pupil may be used as the optical filter for modulating the light in amplitude distribution. For another example, an optical filter constructed of a glass plate and a transparent dielectric thin film (for example, $SiO_2$ film) having a refractive index of n and deposited on the glass plate to a thickness of $\lambda/2n$, where $\lambda$ is the wavelength of the light used, may be used as the optical filter for modulating the light in phase distribution.

A feature of the invention includes the processes using a photoresist layer subjected to anti-dissolution surface treatment, narrowing the spot diameter of a zero-th diffracted beam irradiated on the photoresist layer by means of a super resolution optical system, and effecting high contract development to leave behind, as it is, a portion of the photoresist layer exposed to adverse higher order diffracted beams caused by super resolution, whereby a diffraction structure having guide tracks of narrower width and smaller pre-pits than those determined by a diffraction limit according to a wavelength of light used can be produced.

An optical disk according to one feature of the invention includes a diffraction structure comprised of tracks and/or pre-pits formed along a spiral track or concentric tracks and having a width narrower than those determined by a diffraction limit according to a wavelength of light used in the course of formation of the diffraction structure. The width of the diffraction structure comprised of the guide tracks and/or pre-pits measures 0.2 to 0.4 µm. The boundary area between the diffraction structure and the other portion of the substrate surface is not rounded but is sharpened.

According to another feature of the invention, there is provided a master disk cutting machine including a super resolution optical system constructed by an optical filter provided with a proper modulation area, the super resolution optical system being capable of performing exposure for formation of a pattern of a diffraction structure comprised of small pre-pits and narrow-width guide tracks suitable for a high density optical disk. Obviously, by decreasing the wavelength of the laser source used for the cutting machine, the reduction the width of the pre-pits and guide tracks can be enhanced. By combining the anti-dissolution surface treatment for the photoresist layer with the super resolution optical exposure system, an optical disk master suitable for high-density formation can be obtained at low costs. Then, by using replica disk mass production technique, high density optical disks can be produced from the master disk at low costs.

BRIEF DESCRIPTION OF THE DRAWINGS

FIGS. 10A to 10C are diagrams for explaining the conventional master disk production process;

FIG. 11 is a schematic diagram showing another embodiment of the master disk cutting machine according to the invention;

FIGS. 12A to 12E are diagrams for explaining the optical disk production process according to the invention.

DESCRIPTION OF THE PREFERRED EMBODIMENTS

The principle and embodiments of the invention will now be described with reference to the accompanying drawings.

Figure 5:
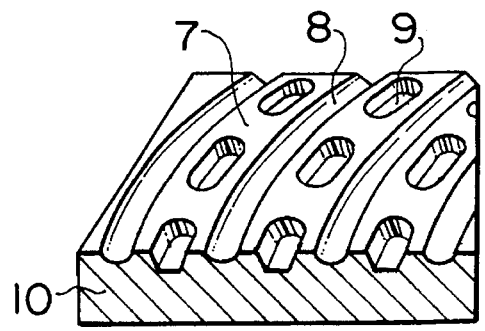
FIG. 5 is a perspective, partly sectioned view showing a schematic construction of an optical disk.

A pre-formatted signal representative of record addresses of data and a timing clock and a signal for guiding a write read light beam along a track must be formed, in the form of relief shaped pre-pits 9 and guide groove 8, respectively, along a spiral track or concentric tracks 7 in the surface of an optical disk 10, as shown in FIG. 5. Since the diffraction of light due to the relief shape is utilized for reading, conditions are imposed on the physical geometry (diffraction structure) of the pre-pits 9 and guide groove 8 in order that read signals of proper magnitudes can be produced from the pre-pits 9 and guide groove 8 under the irradiation of the read light beam. More specifically, given that the wavelength of a light beam of a drive system (write/read system) is $\lambda$ and the refractive index of the disk is n, proper depths of the pre-pit 9 and guide groove 8 are about $\lambda/4n$ and $\lambda/8n$, respectively. The width, in a direction orthogonal to the guide track, of the pre-pit 9 and guide groove 8 is closely related to a spot diameter of the read light beam and its proper value is approximately half the spot diameter. On the other hand, the track pitch is closely related to recordable data density and determined by an interference occurring between adjacent tracks, that is, a cross talk. It follows, therefore, that the track pitch is limited by the optical spot diameter and cannnot be narrower than the optical spot diameter. Given that the numerical aperture of an object lens in the drive system is NA, the optical spot diameter is $\lambda/NA$. It is to be noted from the foregoing that a decision rule by the optical spot diameter or light wavelength is predominant in the optical disk system.

One feature of the present invention resides in the provision of a method of making a diffraction structure having prepits and guide groove whose widths are narrower than a diffraction limit defined by the light wavelength.

Figure 1:
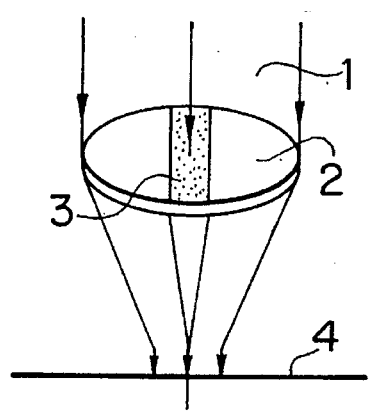
FIGS. 1 and 4 are diagrams useful in explaining the concept of a super resolution optical system used in the present invention.
Figure 2:
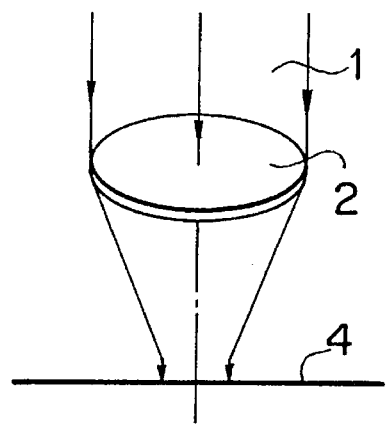
FIG. 2 is a diagram useful in explaining the concept of a conventional optical system.
Figure 3A:
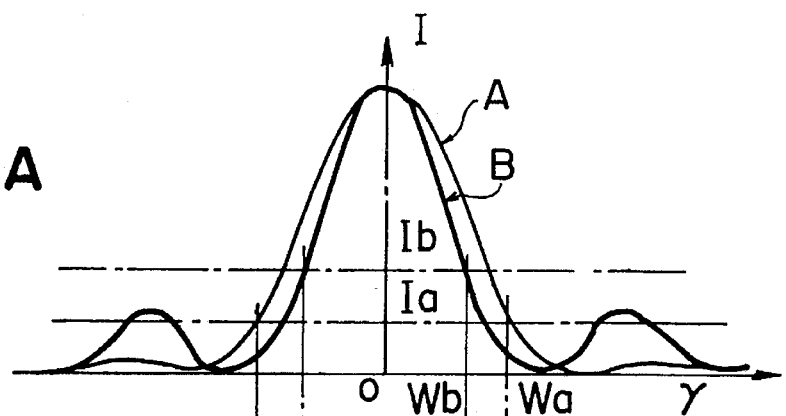
FIGS. 3A and 3B are diagrams for explaining the operational principle of the invention.
Figure 3B:
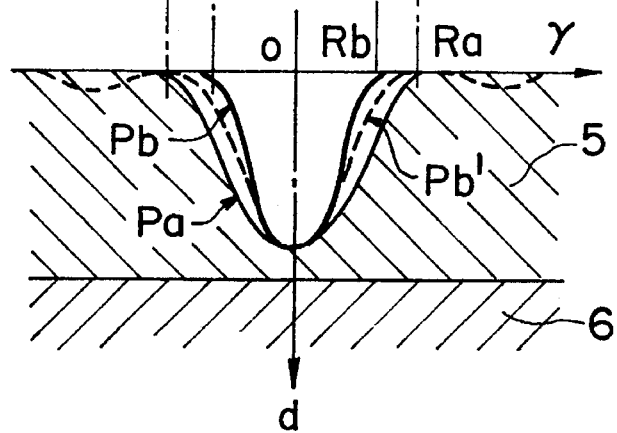
Figure 4:
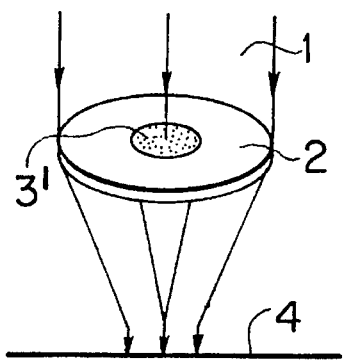

FIG. 1 depicts the essential part of a super resolution optical system to show a construction wherein a linear stop 3 is provided on the surface of a recording lens 2 of a cutting machine to remove a central linear portion of a write light beam 1. In the past, the cutting machine has been used together with a recording lens having its surface removed of the linear stop as shown in FIG. 2. The optical spot intensity distribution on a focal plane 4 of the lens 2 is set up as shown in FIG. 3A, where r is the distance from the center of focus, I is the intensity of light, a thin curve A is an optical spot intensity distribution obtained in the case of FIG. 2 without the linear stop and a thick curve B is an optical spot intensity distribution obtained in the case of FIG. 1 with the linear stop. FIG. 3A demonstrates that when light is stopped at the central portion, the width of distribution is narrowed at the zero-th diffracted beam but the first order diffracted beams appearing on both sides of the zero-th diffracted beam are intensified. This phenomenon also takes place when a circular stop 3' as shown in FIG. 4 is used and is called super resolution. The super resolution is described in detail in, for example, "Wave Optics" by Hiroshi Kubota, Iwanami Shoten, 1971, pp. 175–177. Similarly, this phenomenon can be caused by using a phase modulation member for changing the phase distribution, such as a transparent dielectric thin film for delaying the phase by $\pi$ radians, in place of the stop 3 or 3' adapted to change the amplitude distribution of light. This phenomenon, however cannot be introduced directly into the optical system of the cutting machine because the intensity of the first order diffracted beams due to the super resolution appearing on both sides of the zero-th diffracted beam is excessive so that portions exposed to the first order diffracted beams are also developed through the conventional development process. More particularly, as far as the conventional threshold value for development as indicated at Ia in FIG. 3A is used, portions exposed to higher order diffracted beams exceeding the threshold value are also developed and therefore the super resolution optical system cannot be used. In the ordinary optical system, the inner part of spot radius Wa corresponding to the threshold value Ia can be developed and at that time a photoresist layer 5 of a master disk has a sectioned contour defined by a curve Pa having width Ra as shown in FIG. 3B. If an optical system using super resolution as shown in FIG. 1 or 4 is used in combination with the conventional development process, even portions exposed to the first order diffracted beams are developed as indicated at a dotted curve Pb' and a resulting master disk is unsuitable for production of optical disks. In the present invention, a photoresist layer subjected to an anti-dissolution surface treatment is used to permit high-threshold development process, thereby increasing the effective gamma value of the photoresist layer. When a high-threshold development process is employed so that the threshold light intensity is raised to Ib as shown in FIG. 3A, the sectioned contour of the layer defined by a thick curve Pb as shown in FIG. 3B is obtained to provide a narrow track width Rb, thereby ensuring that a master disk for optical disks can be obtained which has guide grooves and small pre-pits suitable for a high density optical disk. An optical disk substrate replicated from this master disk has guide groove or grooves 8 or pre-pits 9 formed along a spiral track or concentric tracks 7 wherein the guide groove or the pre-pit has a width which is narrower than a diffraction limit determined by the light wavelength used upon its formation and which measures, for example, 0.2 to 0.4 µm, thereby making it possible to increase the track density to about 2.5 times the conventional track density. In addition, the density in a direction along the track can be increased by about 2.5 times in a similar manner and the density of an optical disk as a whole can be increased to about 6 times the density of the conventional optical disk.

Thanks to the anti-dissolution surface treatment of the photoresist layer of the master disk, the surface of the substrate is hardly developed at the other portion than the guide grooves and pre-pits to conserve the photoresist-layer-coated surface and consequently an optical disk having less surface roughness and less surface noise can be obtained.

Figure 6:
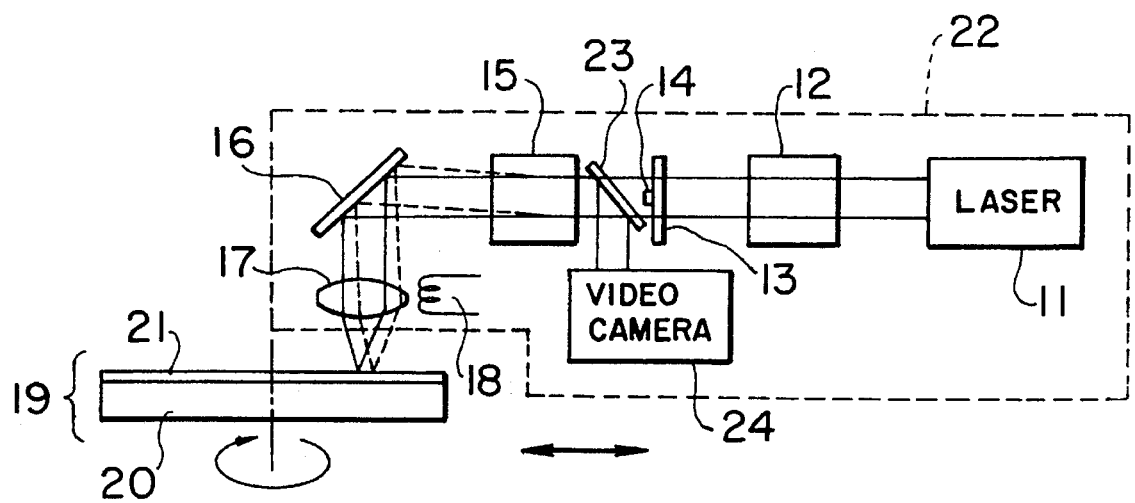
FIG. 6 is a schematic diagram showing an embodiment of a master disk cutting machine according to the invention.

Referring now to FIG. 6, an embodiment of a super resolution optical system will be described specifically which is constructed by using a filter plate having a stop area for modulation of the light amplitude distribution.

FIG. 6 is a schematic diagram of a cutting machine using a single write light beam. A super resolution recording optical system is generally designated by a dotted block 22 and a master disk 19 to be processed is driven for rotational and relative translational movements as indicated by arrows so that a spiral pattern or concentric patterns may be formed. A light beam emitted from a laser 11 is modulated in intensity by a write signal (signal for formation of pre-pits such as addresses and clock or a signal for formation of guide grooves) by means of a light modulator 12 and then passes through a filter plate 13. At that time, a stop area 14 provided on the filter plate 13 changes the light beam in its intensity distribution and the resulting beam enters a light deflector 15, which is responsive to a drive signal to deflect the input light beam, thus delivering the output light beam as indicated at dotted line. This light beam is reflected at a mirror 16 and focused on a photoresist layer 21 of a master disk 19 by means of a recording lens 17. The photoresist layer 21 is coated on a flat glass substrate 20 by spin coating. The position of the recording lens 17 is so controlled as to focus the light beam on the photoresist layer by means of a servo system 18 using a voice coil. With this construction, the photoresist layer 21 is exposed to the light having an intensity distribution as shown at curve B in FIG. 3A. If the light deflection is not required for formation of a pattern or patterns, the light deflector 15 may be omitted, but with the light deflector 15 used, the filter plate 13 must be disposed closer to the light source than the light deflector 15.

For example, when a pattern including tracking pits (pre-wobble pits) for sampled servo system is desired to be formed, the light deflector 15 is needed. Since the optical spot intensity distribution depends on the position at which the filter plate 13 occupies the cross-sectional area of the light beam, it is necessary to set the position of the filter plate 13 accurately. Accordingly, a beam splitter 23 is placed in the optical path to take out the reflected beam from the photoresist layer 21 to a video camera 24, thereby ensuring that while observing a spot image on the photoresist layer which is picked up by the video camera, the disposition and location of the filter plate 13 can be set.

Figure 7A:
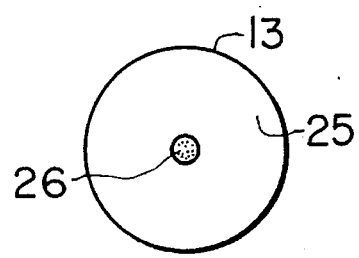
FIGS. 7A to 7D are diagrams showing examples of an optical filter used in the invention.
Figure 7B:
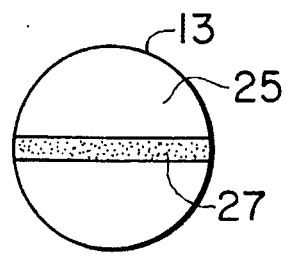
Figure 7C:
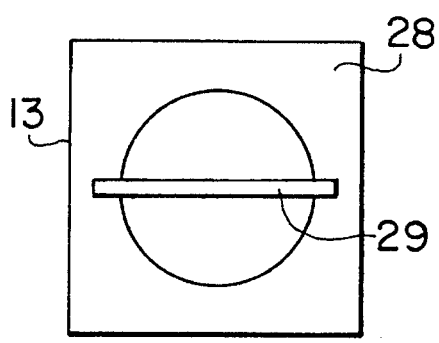
Figure 7D:
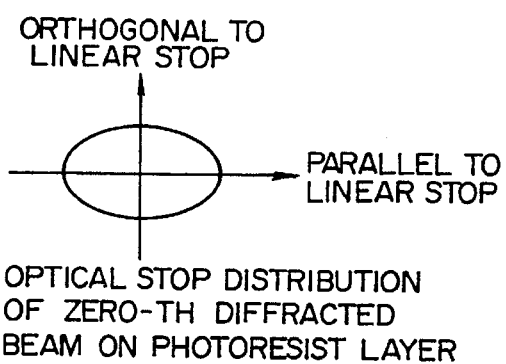

FIGS. 7A to 7C illustrate examples of the filter plate 13 used as an optical filter in the present embodiment. In particular, FIG. 3A illustrate an optical filter constructed of a filter plate 13 having a central, circular stop area 26. The stop area 26 is opaque and applied on a transparent glass plate 25. Preferably, the stop area may be formed of a film of metal having high thermal resistance and oxidation resistance such as Cr. The circular stop area 26 is of point symmetry and non-directivity and therefore it permits the light to be diffracted in a direction parallel to the track and in a direction orthogonal thereto. Accordingly, the FIG. 7A example is suitable for formation of small pits. FIG. 7B illustrates a filter plate 13 having a linear stop area 27. In this example, higher order diffracted beams are generated in a direction orthogonal to the linear stop 27. This stop area has therefore directivity and when the filter plate 13 is disposed such that the longitudinal direction of the linear stop 27 is parallel to the track direction, the optical spot of zero-th diffracted beam on the photoresist layer 21 has the form of an ellipse which has a longer axis in the track direction as shown in FIG. 7D. By making the groove pattern with this optical spot, a guide groove of narrow width can be formed. A filter plate 13 illustrated in FIG. 7C also has a linear stop area 29. The filter plate 13 has a frame 28 and the stop area 29, formed of a thin wire, is mounted to the frame. The function of the FIG. 7C example resembles that of the FIG. 7B example. In place of the optical filter provided with the stop area 26, 27 or 29 formed of an opaque film of, for example, Cr, an optical filter formed of a transparent dielectric thin film such as a $SiO_2$ film may be used wherein given that the thin film has a refractive index of n, this film is applied to the glass place 25 to a thickness of $\lambda/2n$ when the wavelength of light used is $\lambda$, in order to achieve modulation of the phase distribution of the light.

Figure 8:
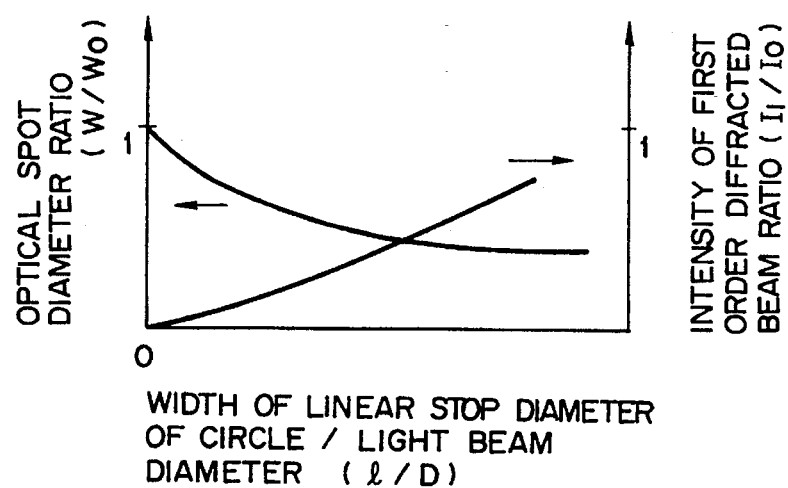
FIG. 8 is a graph showing how the size of a modulation area is related to the optical spot diameter ratio and the diffracted beam intensity ratio.

When a light beam having a beam diameter D passes through a filter plate 13 with a stop area of a width or diameter of l and is then focused by means of the recording lens 17, obtained spot diameter W and first order diffracted beam intensity I1 are related to the ratio l/D as graphically shown in FIG. 8, where Wo and Io represent light spot diameter and Zero-th diffracted beam intensity, respectively, obtained when the stop area is removed. FIG. 8 demonstrates that as the width or diameter l of the stop area is increased, the optical spot diameter W decreases but the first order diffracted beam intensity I1 increases. This requires the threshold value of development to be raised. The ratio of the zero-th diffracted beam intensity to the total light intensity decreases. Therefore, in order to obtain a zero-th diffracted beam of predetermined intensity, the laser beam emitted from the laser 11 must be increased in intensity. For these reasons, the width or diameter l of the stop area is limited practically and the ratio l/D may preferably be 0.1 to 0.3.

Figure 9A:
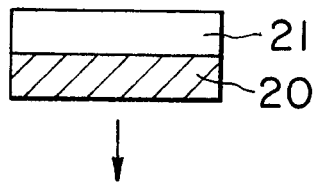
FIGS. 9A to 9D are diagrams for explaining the master disk production process according to the invention.
Figure 9B:
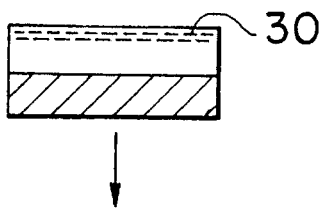
Figure 9C:
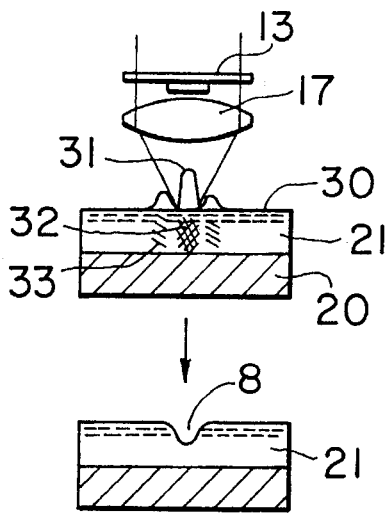
Figure 9D:
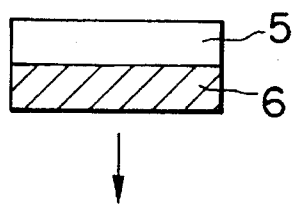
Figure 10B:
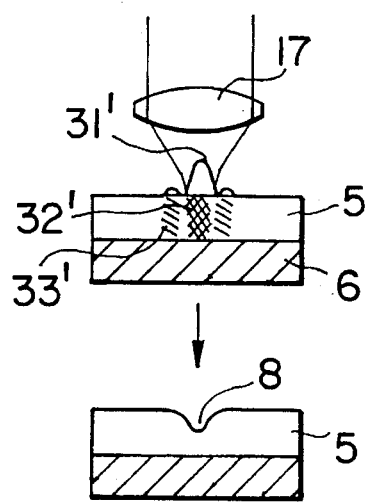

FIGS. 9A to 9D show an example of a master disk making process according to the present invention. In this process, a positive type photoresist layer 21 is first formed on a glass substrate 20 by spin coating in a step as shown in FIG. 9A and thereafter the surface of the photoresist layer 21 is subjected to anti-dissolution treatment in a step as shown in FIG. 9B. The mechanism of the anti-dissolution surface treatment using developer is as follows. When an unexposed resist layer is brought into the developer, base resin in the resist surface first contacts the developer so as to be ionized and dissolved into the developer. At that time, dissolution inhibitor in the resist also dissolves but due to the fact that the ionized base resin alone has hydrophilic properties, only the ionized base resin dissolves during the subsequent water washing. On the other hand, the dissolution inhibitor not having hydrophilic properties does not dissolve and it remains on the surface. In this manner, there is formed in the resist surface a layer in which the concentration of the dissolution inhibitor is raised relative to that of the base resin. When the resist layer is subsequently dried, the boundary area is fixed and there is formed on the surface an anti-dissolution layer which has less solubility to the developer. Accordingly, in the present embodiment, the unexposed photoresist layer 21 is immersed in the developer during a short period of time and thereafter washed with water and dried. Using the above process, an anti-dissolution layer 30 is formed in the surface of the photoresist layer 21. This layer 30 is difficult to develop, except for the portion of surface of the photoresist layer, and is sufficiently exposed to light in the extent that cross link bonding among molecules of the photoresist layer is completely decomposed and the remaining portion becomes an anti-dissolution layer 30 which is difficult to develop. The processing or treatment for anti-dissolution layer is disclosed in for example, JP-A-63-114127. Subsequently, in a step as shown in FIG. 9C, exposure for formation of a desired pattern is carried out with the cutting machine shown in FIG. 6 or one to be described later with reference to FIG. 11. In the super resolution optical system having the optical filter comprised of the filter plate 13 shown in FIG. 7A, 7B or 7C, the light beam passes through the filter plate 13 and is focused on the surface of the photoresist layer 21 by means of the lens 17. As has already been described with reference to FIG. 3, an optical spot 31 on the photoresist layer surface is affected by the super resolution phenomenon to have the zero-th beam component and higher order beam components and corresponding thereto, latent images 32 and 33 are formed in the photoresist layer 21. The latent image 33 of the higher order beam is more intensive than that obtained with the conventional method but thanks to the anti-dissolution layer 30, the latent image 33 does not dissolve during the subsequent step of development process as shown in FIG. 9D and eventually only the latent image 32 of the zero-th beam component dissolves to form a relief shaped pattern of diffraction structure, for example, guide grooves 8. The optical spot diameter of the zero-th beam component affected by the super resolution phenomenon is so small that the thus obtained guide groove 8 has a width which is narrower than a diffraction limit determined by the wavelength of the light used.

FIG. 11 shows another embodiment of the super resoltuion optical system according to the invention. In this embodiment, the present invention is applied to a master disk cutting machine using two write beams, and the present embodiment is used for making an optical disk with header for on land (inter-grooves) recording and suitable for simultaneous recording of guide grooves and preformatted signals (pre-pit train) indicative of addresses and clocks between adjacent guide grooves, implying suitability of this embodiment for making master disks for high-density 5-inch write once type optical disk and high-density rewritable magneto optical disk pursuant to the international standard. A laser beam emitted from a laser source 11 is split into two light beams by means of a beam splitter 34. While one beam is first changed in its direction by a mirror 34' and then enters a light modulator 12' the other beam directly enters a light modulator 12. These beams are then modulated in intensity by predetermined write signals (signals for formation of guide grooves and signals for formation of pre-pits such as addresses and clock) by means of the light modulators 12' and 12 respectively, pass through optical filters comprised of filter plates 13' and 13 respectively, and through mirror 35' and beam splitter 35, respectively, and are focused on a photoresist layer 21 of a master disk 19 through mirror 16 and recording lens 17. The two light beams impinge on the recording lens 17 at different incident angles. An angle between the two beams is determined by the focal length of the recording lens 17 and a predetermined distance between patterns (for example, see FIG. 5) to be formed on the master disk by the two beams.

In the present embodiment, the shape of stop areas 14 and 14' of the filter plates 13 and 13' provided for the respective beams may be so selected as to meet the purposes the individual beams have. For example, when the beam is for formation of guide grooves, the optical filters may be comprised of filter plates 13 and 13' having a linear stop area 27 or 29 shown in FIG. 7B or 7C and may be disposed such that the linear stop area 27 or 29 is parallel to the track. On the other hand, when the beam is for formation of pits, the optical filter may be comprised of filter plate 13 having a linear stop area 27 or 29 shown in FIG. 7B or 7C and may be disposed such that the linear stop area 27 or 29 is orthogonal to the track; otherwise the optical filter comprised of filter plate 13 having a circular stop area 26 shown in FIG. 7A may be disposed. In this manner, it is possible to obtain the guide track having a narrow width less than the diffraction limit and the pre-pit having a narrow width less than the diffraction limit in the track direction or having a small diameter less than the diffraction limit.

FIGS. 12A to 12E show a production process of an optical disk according to the invention. Illustrated in FIG. 12A is an optical disk master 19 prepared through process shown in FIGS. 9A to 9D and having a desired pattern. Specifically, formed in a photoresist layer 21 coated on a flat glass substrate 20 is a relief shaped pattern (diffraction structure) including guide grooves and pits having narrow widths less than a diffraction limit determined by the wavelength of the light used in the master disk cutting machine. An anti-dissolution surface layer 30 exists in the surface of the photoresist layer 21. Subsequently, as shown in FIG. 12B, a conductive film 41 is deposited on the pattern formed surface of the optical disk master 19 by evaporation or sputtering and the conductive film 41 is used at an electrode so that a plating film 42 of, for example, nickel is formed on the conductive film 41 by electroplating. FIG. 12C shows a stamper 43 produced from the master disk 19. By using this stamper 43, a replica disk (optical disk substrate) 40 is prepared through injection molding or by a molding method using ultra-violet-photopolymerizable resin and an information recording film 44 is deposited on the replica disk substantially uniformly by evaporation or sputtering to form a single optical disk 45 as shown in FIG. 12D.

The kind of the recording film 44 is properly selected in accordance with the type of recording (for example, magneto optical recording, phase change recording or ablative recording). If necessary, an enhance layer and a protective film may be formed. Two of single optical disks 45 are put together through an adhesive layer 47 such that their recording films 44 oppose to each other, and hubs 46 are mounted with their central holes 48 aligned with the rotation center of the substrates 40, thus forming a double sided recording optical disk as shown in FIG. 12E. Alternatively, two of single optical disks 45 may be put together through an inner spacer and an outer spacer to form an optical disk of air-sandwich structure or a single optical disk 45 as shown in FIG. 12d may be mounted with a hub to form a single sided recording optical disk. In this manner, replica technique permits mass production of optical disks having small-sized guide grooves and pre-pits from the master disk according to the invention. In other words, mass production of high recording density optical disks can be ensured.

Figure 13A:
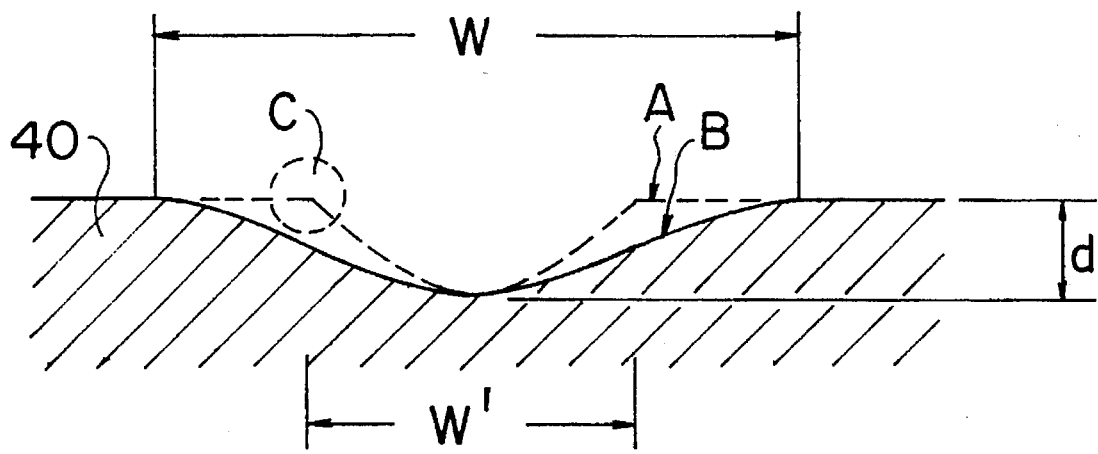
FIGS. 13A and 13B are sectional views illustrating an optical disk substrate according to the invention.
Figure 13B:
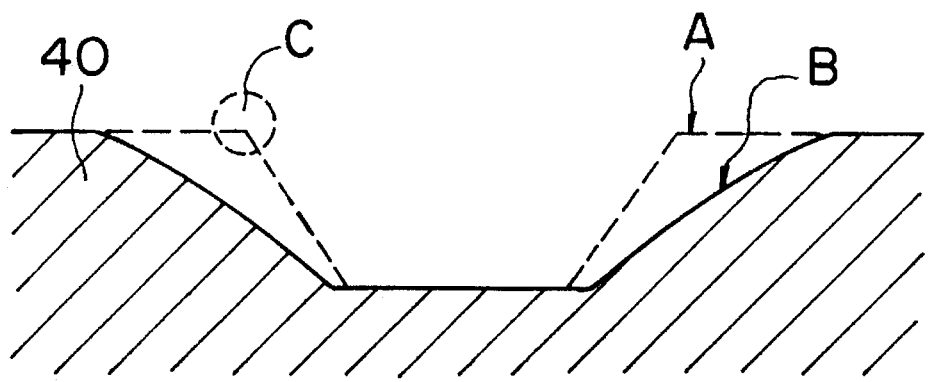

FIGS. 13A and 13B schematically show sections of an optical disk substrate 40 prepared through replica technique by using a master disk according to the invention. In particular, FIG. 13A shows a section of the guide groove 8 having a depth of about $\lambda/8n$ and FIG. 13B shows a section of the pit 9 having a depth of about $\lambda/4n$. In these Figures, the sectional contour obtained with the present invention is indicated by dotted curve A and that obtained with conventional method is indicated by solid curve B, where the wavelength of light source and the numerical aperture NA of recording lens used in the master disk cutting system are of the same values for the present invention and the conventional method. The sectional contour according to the present invention has such outstanding features that not only the width is narrowed but also an edge portion C of the track or pit is not rounded in contrast to the substrate prepared using the conventional master disk but is sharpened having a small radius of curvature.

These features are due to the fact that the photoresist layer undergoes the anti-dissolution surface treatment in the course of production of the master disk as described previously and therefore development is not carried out completely, leaving behind a portion less affected by exposure which is subsequently transferred as it is. As in the precedence, the photoresist layer of the master disk is hardly developed at the other portion than the grooves and pits, that is, at the land and the photoresist layer surface as coated at the land remains unchanged. Accordingly, an optical disk of less surface roughness and less surface noise can be obtained.

In the presently available master disk cutting machine, the recording lens has a numerical aperture NA of about 0.9 and the write beam has a spot diameter of about 500 nm because a 458 nm wavelength beam of an Ar laser or a 442 nm wavelength beam of a He-Cd laser is used in many applications. Thus, the track so formed by the conventional method as to have a depth d necessary for tracking of the optical disk is allowed to have a limited minimal width W of about 0.5 μm.

However, by selecting a value of about 0.15 of the afore-mentioned l/d in accordance with teachings of the present embodiment, the groove or pit can be obtained having a width W' which is about 260 nm measuring half the conventional width. In other words, an optical disk can be obtained in which there is pre-formatted a diffraction structure comprised of guide grooves pre-pits having a width of 0.4 to 0.26 μm which is narrower than the diffraction limit determined by the wavelength of the write beam used.

Since the track pitch of the optical disk can be narrowed to about 2.5 times the width of the guide groove or pre-pit, an optical disk produced in accordance with teachings of the afore-mentioned embodiment can have a narrowed track pitch of about 650 nm equivalent to the track density which is about 2.5 times that of the existing optical disk. Similarly, the density in a direction along the track can also be increased to 2.5 times. Accordingly, a high density optical disk can be obtained which is increased in density to about 6 times the conventional density.

We claim:

1. A method of making an optical disk master from which disks are replicated, comprising the steps of:

preparing a disk deposited with a photoresist layer having its surface subjected to an anti-dissolution treatment;

focusing a light beam intensity-modulated by a signal to be recorded on said photoresist layer by means of a super resolution optical system; and moving said disk and said light beam relative to each other to form, in said photoresist layer, a latent image pattern corresponding to said signal to be recorded and enabling formation of a pit or groove having an overhang-free structure in the disk master from which disks are replicated.

2. An optical disk master making method according to claim 1 wherein said super resolution optical system includes an optical filter for modulating said light beam in at least one of amplitude distribution and phase distribution, and a lens for focusing the light beam passing through said optical filter on said photoresist layer.

3. An optical disk master making method according to claim 2 wherein said optical filter has at its central portion a linear modulation area having a width narrower than a cross-sectional area of the light beam incident to said optical filter so that an optical spot to be focused on said photoresist layer may be elongated in a direction parallel to a track on the photoresist layer.

4. An optical disk master making method according to claim 2 wherein said optical filter includes at its central portion a circular modulation area having a cross-sectional area smaller than that of the light beam incident to said optical filter.

5. An optical disk master making method according to claim 2 wherein said optical system includes means for deflecting the light beam passing through said optical filter.

6. An optical disk master making method according to claim 2 wherein used said optical filter includes a plurality of optical filters having differently shaped modulation areas, and a plurality of light beams passing through said plurality of filters are incident to said lens at different angles.

7. An optical disk master making method according to claim 1 wherein said anti-dissolution treatment includes the steps of immersing said photoresist layer still remaining unexposed in a developer, washing it with water and drying it.

8. An optical disk master making method according to claim 1, further comprising the step of producing a replica optical disk from the optical disk master.

9. An optical disk having at least one replica disk produced from the optical disk master made by the making method as recited in claim 8.

10. A double sided recording optical disk comprising two of the optical disks as recited in claim 9, said two optical disks being put together through adhesive layer such that their recording films oppose to each other.

11. An optical disk produced from the optical disk master made by the making method as recited in claim 8, comprising:

a disk having one major surface in which a diffraction structure having a width falling within a range of from 0.2 to 0.4 µm is formed along a spiral track or concentric tracks; and a recording film formed on said major surface.

12. An optical disk according to claim 11 wherein the boundary area between said diffraction structure and said major surface is not rounded but is sharpened.

13. An optical disk according to claim 11 wherein said diffraction structure includes a guide groove for guiding a light beam irradiated on said optical disk.

14. An optical disk according to claim 11 wherein said diffraction structure includes pre-pits representative of a record of a pre-formatted signal.

15. An optical disk master making method according to claim 8, wherein the replica optical disk has one major surface in which a diffraction structure having a width falling within a range of from 0.2 to 0.4 µm is formed along a spiral track or concentric track and a recording film is formed on the major surface.

16. An optical disk master making method according to claim 8, further comprising the step of producing another replica disk from the optical disk master, and bonding the replica optical disk and the another replica optical disk together through an adhesive layer such that recording films thereof are opposed to each other.

17. An optical disk master making method according to claim 1, wherein said super resolution optical system includes a filter for modulating at least one of a phase and amplitude of part of the light beam focused on said photoresist layer.

18. A method according to claim 1, wherein the step of focusing a light beam intensity-modulated by a signal to be recorded on said photoresist layer includes focusing the light beam on said photoresist layer which has had its surface subjected to the anti-dissolution treatment, and the step of moving said disk and said light beam relative to each other to form, in said photoresist layer, a latent image pattern includes forming the latent image pattern in said photoresist layer having had its surface subjected to the anti-dissolution treatment.

19. An optical disk master cutting machine for a master disk from which disks are replicated, comprising:

a super resolution optical system for generating a light beam intensity-modulated by a signal to be recorded; and drive means for relatively moving said super resolution optical system and a master disk having on its surface a photoresist layer to form, in said photoresist layer, a latent image pattern corresponding to said signal to be recorded;

said super resolution optical system including light source means for emitting a light beam representative of a pre-formatted signal, an optical filter for modulating the light beam in at least one of amplitude distribution and phase distribution, and a recording lens for focusing the light beam passing through said optical filter on said photoresist layer of said master disk so as to enable formation of a pit or groove having an overhang-free structure in said disk master from which disks are replicated;

wherein said photoresist layer has a surface thereof subjected to an anti-dissolution treatment prior to said drive means relatively moving said super resolution optical system and said master disk to form, in said photoresist layer having had the surface subjected to the anti-dissolution treatment, a latent image pattern utilizing said super resolution optical system focusing the light beam on said photoresist layer having had the surface thereof subjected to the anti-dissolution treatment.

* * * * *